United States Patent [19]

Griffin et al.

[11] 4,222,622

[45] Sep. 16, 1980

[54] ELECTRICAL CONNECTOR FOR CIRCUIT BOARD

[75] Inventors: Wendell L. Griffin, Warren; John E. Benasutti, Oil City, both of Pa.

[73] Assignee: GTE Products Corporation, Stamford, Conn.

[21] Appl. No.: 914,641

[22] Filed: Jun. 12, 1978

[51] Int. Cl.³ ............................................. H05K 1/12
[52] U.S. Cl. ................................................ 339/17 CF
[58] Field of Search ............ 339/17 R, 17 CF, 17 M, 339/17 LM, 75 M, 75 MP, 176 MP

[56] References Cited

U.S. PATENT DOCUMENTS

| | | | |
|---|---|---|---|
| 3,479,634 | 11/1969 | Pritulsky | 339/176 MP |
| 3,689,684 | 9/1972 | Cox, Jr. et al. | 339/17 R |
| 3,753,211 | 8/1973 | Pauza et al. | 339/75 MP |
| 3,910,664 | 10/1975 | Pauza et al. | 339/17 CF |
| 3,951,491 | 4/1976 | Mysiak | 339/17 CF |
| 4,089,575 | 5/1978 | Grabbe | 339/17 CF |

*Primary Examiner*—Neil Abrams
*Attorney, Agent, or Firm*—Robert E. Walter

[57] ABSTRACT

A connector for making electrical contact between an external circuit and a planar substrate of the type having opposing faces with the sides having conductive portions thereon includes an insulating housing having an interior area for receiving the substrate. Means are provided for resiliently supporting the substrate on one face thereof. A plurality of contacts are fixedly mounted within the interior area with each contact including a projecting portion adapted to be resiliently biased over the other face of the substrate. The contacts hold the substrate against the resilient supporting means and each contact further includes a portion for contacting conductive portions on the marginal edge portions of the substrate.

1 Claim, 3 Drawing Figures

ELECTRICAL CONNECTOR FOR CIRCUIT BOARD

BACKGROUND OF THE INVENTION

The present invention relates to an electrical connector for making electrical contact between a substrate and an external circuit.

Ceramic substrates commonly have integrated circuit devices mounted in a central portion of a face thereof. Conductive portions extend from the circuit or "chip" to the marginal portions of the substrate face. The substrate is then connected to an external circuit which may be in the form of a board having conductive portions thereon. The ceramic substrate can be mounted in a plane substantially normal to the plane of the board or in a plane substantially parallel to the board.

The connector for making the former type of connection is described in U.S. Pat. No. 3,990,761 to Jayne wherein the edge of a substrate is inserted into a housing by lateral movement along its plane, interconnection of the connector with the board results in the substrate lying substantially in a plane normal to the plane of a board.

To provide connection between the substrate lying in a plane substantially parallel to the plane of the board, the prior art has concentrated on those methods wherein leads are clamped and usually bonded to this ceramic or dielectric substrate. The leads are bent or preformed at right angles to permit plugging into a heater or into a printed circuit board. U.S. Pat. No. 3,689,694 to Cox et al describes such a device where C-clamps which grip the edges have depending portions at right angles to the substrate. A connector is not provided which provides for convenient insertion and removal of a substrate in a connector.

U.S. Pat. No. 3,865,450 describes a connector of the type having a centrally located substrate receiving zone and end terminals having cantilevered arms for contacting the substrate. Locking blocks are provided for holding the substrate in position.

The former type substrates all have enlarged contact areas or contact paths that are formed adjacent the edges of the substrate one or more faces of the substrate for connecting the substrate to external circuitry.

Another type of substrate which lies in a plane substantially parallel to the plane of the board have their contact pad portions located on the sides or ends thereof rather than on the faces. U.S. Pat. No. 3,910,664 to Pauza et al describes a connector of the latter type where the contact areas extend around the edges to the sides of the substrate. Upon insertion of the substrate into the housing, spring portions engage the edges thereof. A strap is provided for securing the circuit within the housing. U.S. Pat. No. 3,753,211 is also illustrative of a connector providing electrical connection to an external circuit from side portions on a substrate.

SUMMARY OF THE INVENTION

Accordingly, it is an object of the present invention to provide a new and improved connector for substrates which provide for electrical connection to the side portions of a substrate.

Further and other objects of the present invention will become apparent from the description contained herein.

In accordance with the principles of the present invention there is provided a connector for making electrical contact between an external circuit and a planar substrate having opposing faces with sides having conductive portions thereon, said connector comprising an insulating housing having an interior area for receiving said substrate, means for resiliently supporting said substrate on one face thereof, a plurality of contacts fixedly mounted within said interior area, each contact including a projecting portion adapted to be resiliently biased over the other face of said substrate and adapted to hold said substrate against said resilient supporting means, each contact including a portion for contacting conductive portions on said marginal edge portions.

DESCRIPTION OF THE PREFERRED EMBODIMENT

Figure 1:
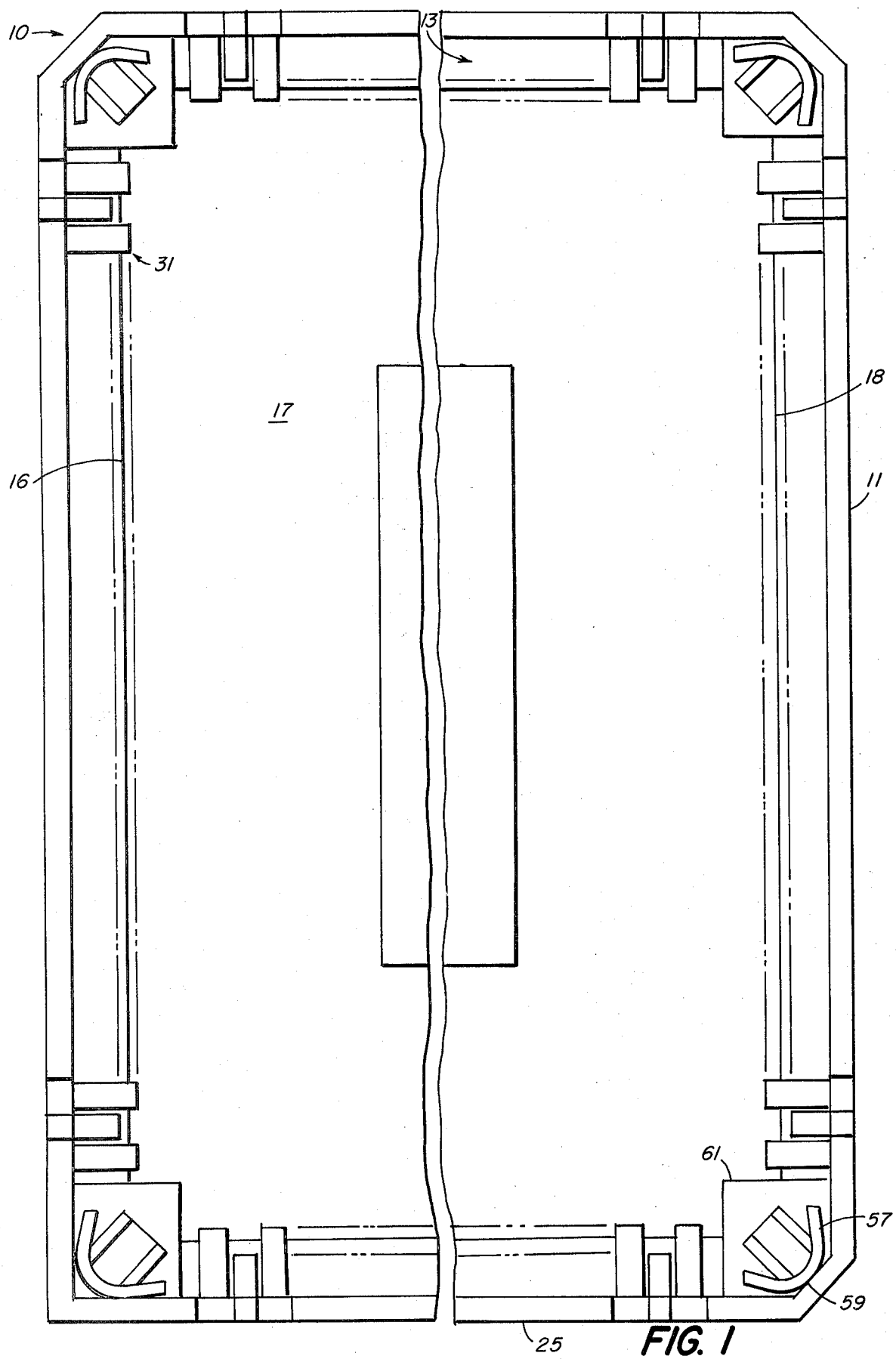
FIG. 1 is a top elevational view of the connector.

Referring to FIG. 1, the connector 10 comprises an insulating housing 11 having an interior area 13. The interior area 13 is formed as an upright walled section 25 of rectangular or square shape having end walls and side walls.

The substrate 15 is of a convential type integrated circuit chip. The circuit chip (not shown) is located in center portion on one side of the planar substrate 15. Leads which provide for electrical connection radiate from the chip and extend across the face to the edges thereof. Various substrates having different configurations may be utilized with the connector of the present invention. The substrate 15 shown in FIG. 1, is of generally rectangular shape with parallel faces 17, 19 meeting side surfaces 16, 18. The face 19 with the chip thereon faces downwardly in the insulating housing 11. The leads from the chip extending across the face 19 extend to the margins of the face, around the edges, and on the sides 16, 18 to form paths or conductive portions 20 along the sides which provide for electrical connection with the chip. Installation of the substrate 15 into the housing 11 is performed by moving the substrate 15 substantially normal to its plane to make electrical connection with the paths or conductive portions 20 on the sides 16, 18. The walled section 25 of the housing 11 surrounds or circumscribes the substrate 15.

Means are provided for resiliently supporting the substrate 15 on the bottom face 19 within the interior area 13. The resilient support 23 comprises a block of yieldable plastic or rubber material which tends to return to its original shape but yields under pressure.

A plurality of electrical contacts 31 are fixedly mounted within the interior area 13. Each of the contacts 31 includes an upstanding portion 37 which is secured to the walled section 25 by a ledge 33. The ledge 33 is attached to the lower portion of the walled section 25 and lies in a plane substantially parallel to the plane of the installed substrate 15. The upstanding portion 37 is mounted and held between ledge 33 and the wall section 25.

The contact 31 can be of any suitable electrically conductive material such as a copper alloy. For purposes of the present invention it is desirable that the contacts retain resilient, flexible and spring-like characteristics. These characteristics can be regulated during manufacture by controlling the configuration of the metal from which the contact 31 is fabricated. The contact 31 is manufactured by suitable forming operations to result in the desired configuration as hereinafter discussed.

Each of the contacts 31 includes a projecting portion 39 which is adapted to be resiliently biased over the top face 17 of the substrate 15 opposite the bottom face 19 having a circuit thereon. The projecting portion 39 is such that when substrate 15 is inserted into the housing 11 the projecting member yields under the compressive force so as to permit the sides 16, 18 to be inserted into the housing. When the top face 17 of the substrate 15 is moved to a point just below the projecting portion 39, the projecting portion snaps or is biased inwardly to grip the top face 17 of the substrate 15. Upward movement of the substrate 15 is thus restrained. Due to the yieldable nature of the resilient support 23, a substrate 15 can be easily inserted and held between the resilient support 23 and the projection portion 39.

The projecting portion 39 is formed as a bend in each of the contacts 31 at the upper end of the upstanding portion 37. The bend is at an acute angle so that the projecting portion 39 extends inwardly and downwardly from the upstanding portion 37. A contact or holding portion of a projecting portion 39 is formed by a reversed bend.

Electrical connection to the external circuit is completed through a contact end portion 53 of each of the contacts 31 which extends inwardly and downwardly from the lower end of the upstanding portion 37 just below ledge 33. The contact end portion 53 terminates in a plane below the bottom surfaces of walled section 25. Portion 53 flexes so as to generate a compressive force when contact is made with the appropriate matching contacts on external circuit.

Electrical connection with the conductive portions on the sides 16, 18 of the substrate 15 are made by a substrate contacting portion or elongated portion 51. The elongated portion 51 extends upwardly from the lower end of the upstanding portion 37. The elongated portion 51 is resiliently biased inwardly so as to yieldably contact the conductive portions 20. The elongated portion 51 is juxtaposed the upstanding portion 37 and the side 16 of the substrate 37 and bent in such a manner so as to form a protuberance 50 which contacts the paths 20. As the circuit board or substrate 15 is inserted into the housing 11 a wiping action is achieved so that good electrical connection can be maintained therebetween.

Figure 2:
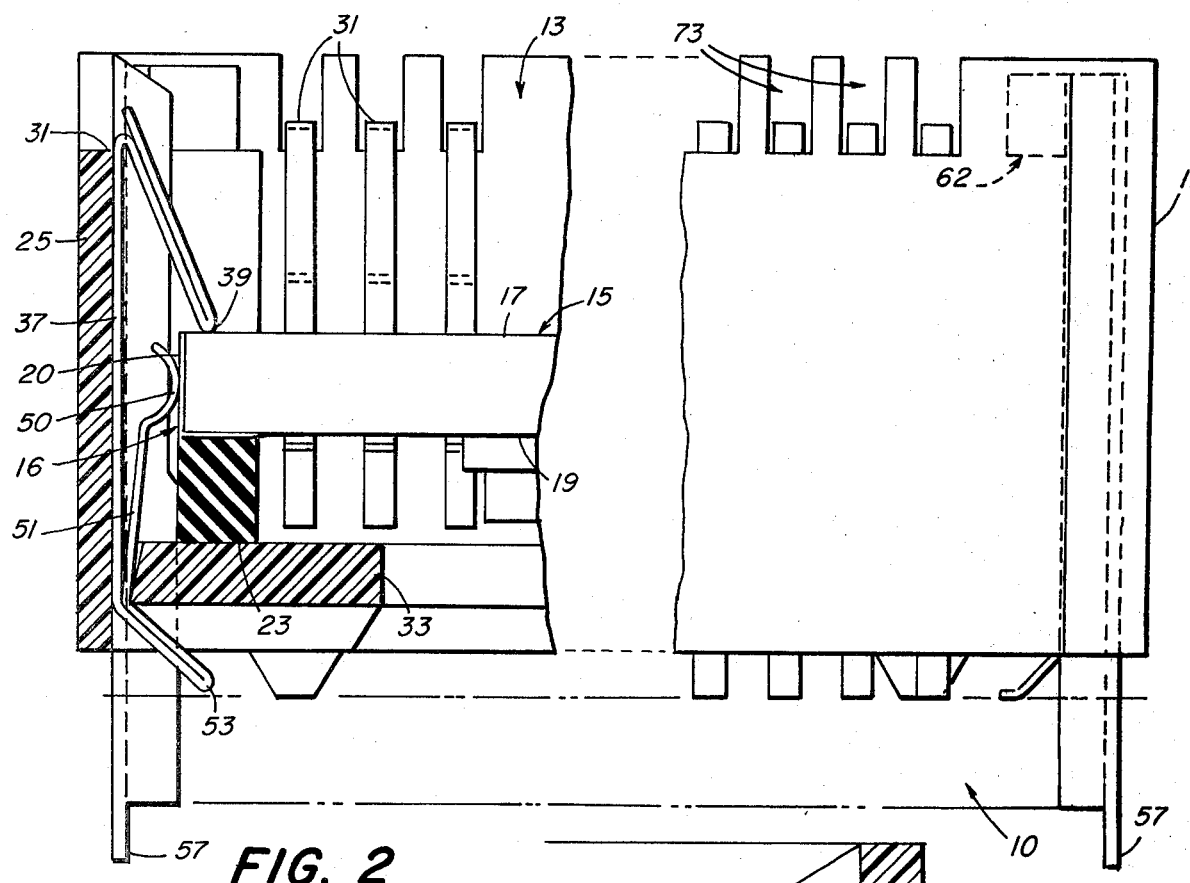
FIG. 2 is a side elevational view of the connector.
Figure 3:
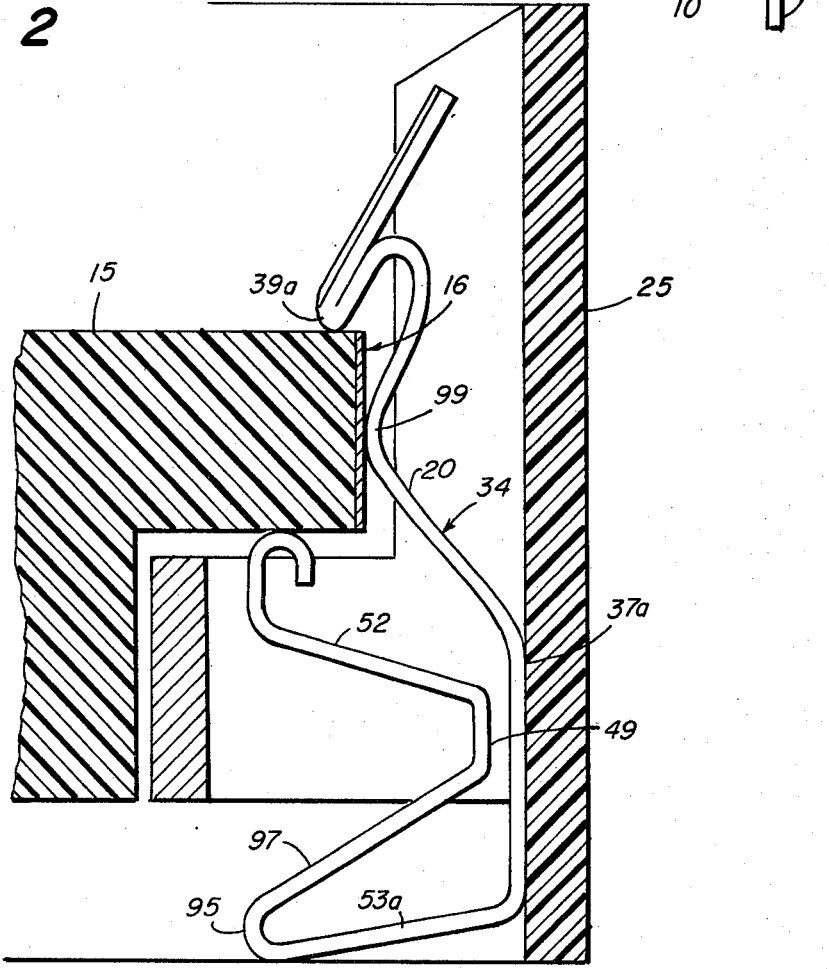
FIG. 3 is a side elevation of a contact terminal.

FIG. 3 illustrates another embodiment of the present invention wherein the contact 34 includes a projecting portion 39a, upstanding portion 37a, extended portion 49, substrate supporting portion 52 and end portion 53a. In the embodiment as hereinbefore described, end portion 53a is formed as a free end of the contact 31. In the FIG. 3 embodiment, end portion 53a extends inwardly and downwardly from the lower portion of upstanding portion 37a and includes a bend 95. Bend 95 is connected to extended portion 49 by an upwardly and outwardly sloping straight section 97. The extended portion 49 is adjacent upstanding portion 37a. Supporting portion 51 is formed as a free end of the contact and depends inwardly and upwardly from the extended portion 49 so as to provide a resilient support for substrate 15. In this embodiment, supporting portion 51 serves as a function similar to resilient support 23 as discussed in the previous embodiment. The projecting portion 39a is formed from the other end of the contact 34 and depends from upstanding portion 37a. Substrate contacting portion 99 is formed intermediate projecting portion 39a and a lower part of the upstanding portion 37.

Means are provided for mounting the housing 11 to an external circuit. Mounting posts 57 are secured to each of the rectangular corners of the housing 11. The post 57 is secured to the housing between the inside corner 59 and the section 61. Section 61 can be a separate piece or molded into the housing so as to be integral therewith. An upper shoulder portion 62 extends outwardly from the main body of the post 57. A bottom edge of the shoulder portion 62 abuts an upper surface of the section 61 so as to prevent downward movement thereof.

A plurality of recesses 73 are provided in the top portion of the walled section 25 for providing access for communication with the electrical contact terminals 31. This permits a probe to be inserted for testing a particular circuit while the housings are arranged in a stacked relationship.

The substrate 15 may be rapidly and easily removed from the housing 15 by the use of a tool having a rectangular or square shape so as to conform with the interior surface of the walled section 25. Insertion of a tool into the housing 11 results in the projecting portion 39 of the contacts 31 being urged inwardly toward the inside surface of the walled section 25. A point is reached where the projecting portion 39 releases the substrate 15 and the resilient support 23 urges the substrate upwardly to be accommodated by the tool and permit removal of the substrate 15 from the housing 11.

While the invention has been described herein with reference to preferred embodiment, it is to be understood that changes and modifications may be made by those skilled in the art without departing from the concept of the invention, the scope of which is to be determined by reference to the following claim.

We claim:

1. A connector for making electrical contact between an external circuit and a planar substrate having opposing faces with sides having conductive portions thereon, said conductor comprising an insulating housing having an upright walled section and ledge portion secured thereto forming an interior area, a plurality of fixedly mounted contacts positioned in said interior area, each contact including an upstanding portion, a projecting portion, an end portion, and a substrate contacting portion, said upstanding portion extending above and below said substrate adjacent said wall, said projecting portion being connected to an extending downwardly and inwardly at an acute angle from the upper portion of said upstanding portion and including a reverse bend adapted to be resiliently biased over one face of said substrate, said end portion extending inwardly and downwardly from the lower portion of said upstanding portion and projecting below a plane of the walled section whereby said contact is adapted to generate compressive forces when electrical contact is made with an external circuit, said substrate contacting portion extending upwardly adjacent said upstanding portion and being resiliently biased inwardly for yieldably contacting the conductive portions on the sides of the substrate, and means for resiliently supporting the other face of said substrate.

* * * * *